United States Patent [19]

Kamioka et al.

[11] Patent Number: 4,503,315
[45] Date of Patent: Mar. 5, 1985

[54] SEMICONDUCTOR DEVICE WITH FUSE

[75] Inventors: Hajime Kamioka, Yokohama; Mikio Takagi, Kawasaki; Noriaki Sato, Machida; Motoo Nakano, Yokohama; Takashi Iwai, Hachioji, all of Japan

[73] Assignee: Fujitsu Limited, Kawasaki, Japan

[21] Appl. No.: 453,099

[22] Filed: Dec. 27, 1982

[30] Foreign Application Priority Data

Dec. 28, 1981 [JP] Japan .................... 56-209766

[51] Int. Cl.³ ............................. B23K 27/00
[52] U.S. Cl. ................... 219/121 LE; 219/121 EF
[58] Field of Search .............. 219/121 LE, 121 LH, 219/121 LJ, 121 EJ, 121 EK, 121 PD, 121 PE, 121 EF; 357/42; 29/577 R, 591; 338/195

[56] References Cited

U.S. PATENT DOCUMENTS 4,209,894  7/1980  Keen ......................... 29/591
4,240,094 12/1980  Mader ..................... 357/42 X Primary Examiner—C. L. Albritton
Attorney, Agent, or Firm—Staas & Halsey

[57] ABSTRACT

A semiconductor device with a fuse including an insulating layer having at least one step. A fusible film on the insulating layer crosses the step and a covering film is formed on the fusible film, the step and the insulating layer. When the portion of the fusible film crossing the step is irradiated with a laser beam the portion of the fusible film on the upper surface of the insulating layer melts and flows onto the lower surface of the insulating layer without forming a hole, thereby separating the fusible film at the step.

10 Claims, 6 Drawing Figures

SEMICONDUCTOR DEVICE WITH FUSE

BACKGROUND OF THE INVENTION

1. Field of the Invention

The present invention relates to a semiconductor device with a fuse. More particularly, it relates to fuses (i.e., fusible links) of a programmable read-only memory or a dynamic random-access memory having a redundant organization.

2. Description of the Prior Art

A number of fuses are provided in a semiconductor memory device. In the case of a programmable read-only memory, the fuses are used in the writing of information. In the case of a dynamic random-access memory having a redundant organization, the fuses are used to replace defective memory elements with redundant (spare) rows or columns. The fuses are formed of, e.g., polycrystalline silicon, and are electrically blown by an excess current pulse. Since the fuses are, generally, covered with a film (i.e., a passivation film) of phosphosilicate glass or silicon dioxide, the blown parts of the fuses are in the vicinity of each other and, in some cases, may not completely separate from each other, depending on the circumstances. Furthermore, when a fuse covered with a phosphosilicate glass film is blown, the film becomes opaque, thereby making it difficult to determine with a microscope whether or not the fuse is completely blown. It is possible to blow a fuse with a high-power laser. In such a case, however, a portion of the fuse and a portion of the covering film on it simultaneously melt and evaporate, thereby forming a hole which must be filled with phosphosilicate glass or silicon dioxide.

SUMMARY OF THE INVENTION

It is an object of the present invention to provide a semiconductor device having a fuse which can be blown by an energy beam, e.g., a laser beam, without forming the above-mentioned hole.

It is another object of the present invention to provide a semiconductor device in which a blown fuse can be inspected with a microscope.

These and other objects of the present invention are attained by providing a semiconductor device with a fuse which comprises: an insulating layer having at least one step, the step having slope, an upper surface and a lower surface; a fusible film covering the step of the insulating layer; a conduction line connected to the fusible film; and a covering film formed on the fusible film and the conduction lines. The fuse of the semiconductor device is blown by irradiating a portion of the fusible film on the upper surface and the slope of the step with an energy beam so as to make the portion kmelt and flow onto the lower surface of the step without the irradiated portion of the fusible film and the covering film evaporating.

DESCRIPTION OF THE PREFERRED EMBODIMENTS

Figure 1:
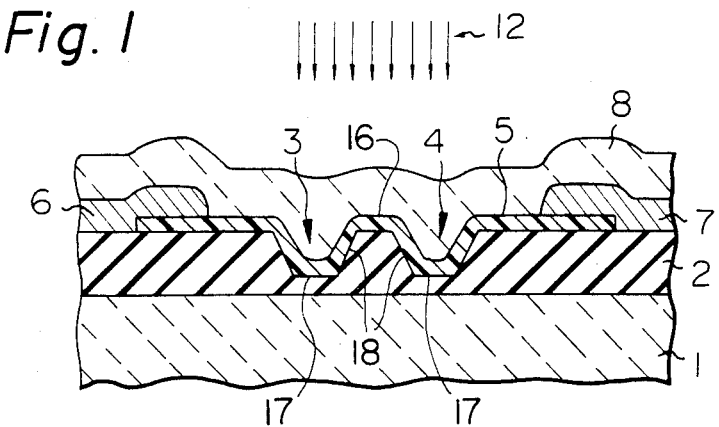
FIG. 1 is a schematic sectional view of a semiconductor device with a fuse of the present invention.

In FIG. 1, there is shown a semiconductor device with a fuse of the present invention. The semiconductor device comprises a semiconductor substrate (e.g., a silicon wafer) 1, an insulating layer 2 made of, e.g., silicon dioxide and provided with two grooves 3 and 4, a fusible film 5 made of, e.g., polycrystalline silicon and crossing the grooves 3 and 4, two conduction lines 6 and 7 made of, e.g., aluminum, and a covering film 8 made of, e.g., phosphosilicate glass and covering the fusible film 5, the conduction lines 6 and 7, and the insulating layer 2.

Figure 2:
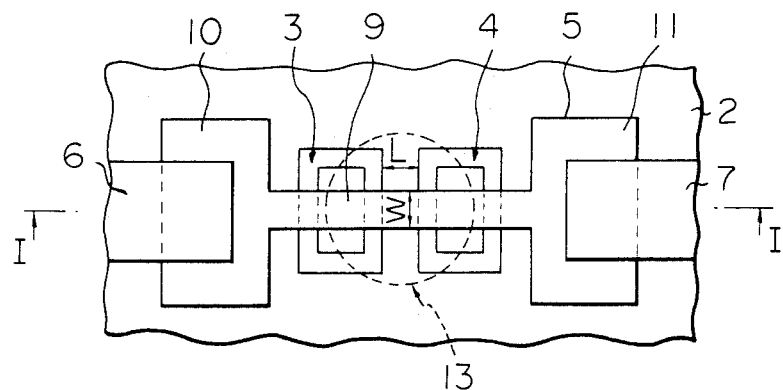
FIG. 2 is a partial plan view of the semiconductor device of FIG. 1.

The shape of grooves 3 and 4 can be seen in FIG. 1. As illustrated in FIG. 1, grooves 3 and 4 each form a step comprising an upper surface 16, a lower surface 17 and a slope 18 connecting the upper surface 16 and the lower surface 17. If the covering film 8 is removed, the shape of the fusible film 5 (illustrated in FIG. 2) can be seen. The fusible film 5 consists of a long narrow center portion 9 which can be cut and wide end portions 10, 11 which are connected with the conduction lines 6 and 7, respectively.

The above-mentioned semiconductor device with a fuse is produced, for example, in the following manner. A silicon wafer 1 is thermally oxidized by a conventional thermal oxidation process to form a relatively thick silicon dioxide (insulating) layer 2 having a thickness of from 0.5 to 1.0 $\mu$m. The silicon dioxide layer 2 is selectively etched by a photoetching process, in which a liquid etchant is used, to form two windows through which portions of the silicon wafer 1 are exposed. The exposed portions of the silicon wafer 1 are thermally reoxidized to form a relatively thin silicon dioxide layer. Thus, two grooves 3 and 4 having a depth of from 0.4 to 0.9 $\mu$m are formed in the silicon dioxide layer 2. Then a polycrystalline silicon (fusible) film 5 having a thickness of from 0.2 to 0.4 $\mu$m is formed on the silicon dioxide layer 2 by a chemical vapor deposition process and is selectively etched by a photoetching process so that it has a predetermined shape illustrated in FIG. 2. The long narrow center portion 9 of the polycrystalline silicon film 5 crosses the formed two grooves 3 and 4. The width W (FIG. 2) of the center portion 9 is approximately 5 $\mu$m and the distance L between the edges of the grooves 3 and 4 is approximately 5 $\mu$m.

An aluminum film having a thickness of from 0.7 to 1.2 $\mu$m is formed on the polycrystalline silicon film 5 and on the silicon dioxide layer 2 by a vacuum evaporation process and is selectively etched by a photoetching process to form two conduction lines 6 and 7.

Finally, a phosphosilicate glass (covering) film 8, having a thickness of approximately 1 $\mu$m, is formed on the conduction lines 6 and 7, the polycrystalline silicon film 5, and the silicon dioxide layer 2.

Figure 3:
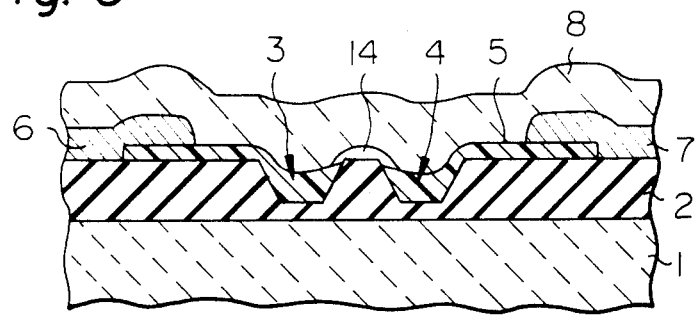
FIG. 3 is a schematic sectional view of the semiconductor device of FIG. 1 after the fuse is blown.

In order to cut the center portion 9 of the polycrystalline silicon film 5, namely, to blow the fuse in the semiconductor device, the center portion 9 is irradiated with an energy beam, e.g., a laser beam 12 (FIG. 1), having an effective laser spot 13 (FIG. 2) so as to make the irradiated center portion 9 melt and flow into the grooves 3 and 4, illustrated in FIG. 3. The laser used is a continuous wave Ar laser having an output power of 10 W, and the diameter of the effective laser spot 13 is approximately 20 μm. More of the energy of the Ar ion laser beam 12 is absorbed by the polycrystalline silicon than by the phosphosilicate glass and silicon dioxide, the result being that the center portion 9 of the polycrystalline silicon film 5 is selectively heated. At the same time, the phosphosilicate glass film 8 and the silicon dioxide layer 2 are heated to a lesser degree than the polycrystalline silicon film 5 by the Ar laser beam 12, and are heated further by the heat of the center portion 9 since the center portion 9 comes into contact with them. It is possible to control the period of laser beam irradiation so that the irradiated center portion 9 melts without evaporating the irradiated center portion 9 and the phosphosilicate glass film 8. It is preferable that the irradiation time be between 10 and 100 μs (microseconds) so that the part of the irradiated center portion 9 between the grooves 3 and 4 flows into the grooves, illustrated in FIG. 3. Thus, the center portion 9 is separated (i.e., cut) between the grooves 3 and 4. The energy of the laser beam used in the present invention is much smaller than that of the laser beam used to blow a conventional fuse. The molten silicon within grooves 3 and 4 solidifies into a polycrystalline state or single crystalline state after irradiation. It is necessary to predetermine suitable dimensions (the width W, length L, and thickness) for the flowing part, of the center portion 9, of the polycrystalline silicon film 5, as well as dimensions of the grooves 3 and 4 so that the grooves can adequately accommodate the flowing part. A cavity 14 (FIG. 3) is generally formed on the silicon dioxide layer 2 between the grooves 3 and 4. The laser beam irradiation does not meet the phosphosilicate glass film 8, it is, however, deformed. Since the grooves 3 and 4 are distant from each other, it is easy to confirm whether or not the center portion 9 is separated (i.e., whether or not a fuse is blown) by determining with a microscope whether or not the irradiated center portion 9 remains intact.

It is possible to use amorphous silicon, aluminum, or metal silicide as a material for the fusible film 5 instead of polycrystalline silicon. It is also possible to use silicon nitride ($Si_3N_4$), tantalum oxide ($Ta_2O_5$), or silicon oxynitride (SiON) as a material for the insulating film 2 instead of silicon dioxide. Furthermore, the covering film 8 can be composed of silicon dioxide ($SiO_2$), silicon nitride ($Si_3N_4$), or silicon oxynitride (SiON) instead of phosphosilicate glass, and the conduction lines 6 and 7 can be composed of molybdenum, tungusten or metal silicide instead of aluminum.

Taking the material of the fusible film into consideration, it is possible to use various kinds of laser beams, instead of an Ar ion laser beam, or an electron beam as an energy beam for blowing the fuse of the present invention.

Figure 4:
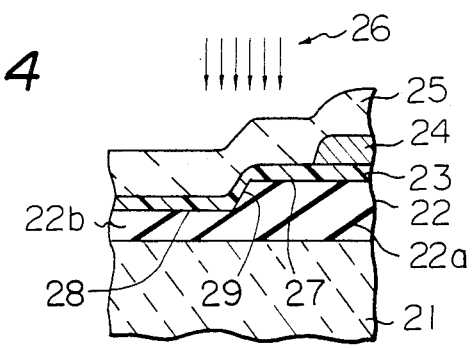
FIGS. 4 through 6 are schematic sectional views of a semiconductor device with various fuse structures of the present invention.
Figure 5:
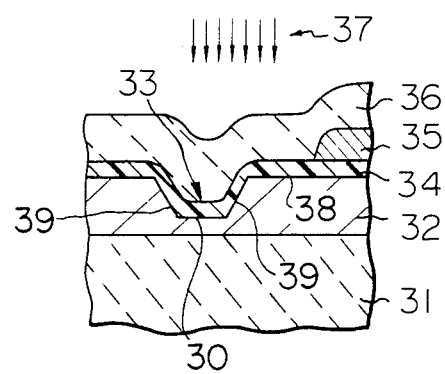
Figure 6:
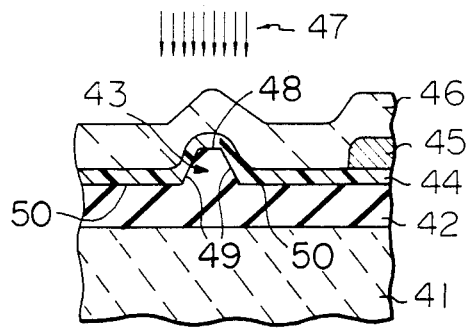

According to other embodiments of the present invention, the insulating layer under a fusible layer has various steps, illustrated in FIGS. 4, 5, and 6.

In FIG. 4, an insulating layer 22 formed on a semiconductor substrate 21 comprises a thick portion 22a and a thin portion 22b which form a step. The thick portion 22a of the insulating layer 22 forms an upper surface 27 of the step and the thin portion 22b of the insulating layer 22 forms a lower surface 28 of the step. A slope 9 connects the upper surface 27 and the lower surface 28. A fusible film 23 is formed on the insulating layer 22 and then a conduction line 24 and a covering film 25 are formed in a manner similar to the above-mentioned production manner. When the fusible film 23 is irradiated with an energy beam 26, the irradiated portion of the fusible film 23 melts and part of the melt, on the thick insulating portion 22a, flows down the slope and onto the thin insulating portion 22b. Thus, the fusible film 23 is cut at the step.

In FIG. 5, an insulating layer 32 formed on a semiconductor substrate 31 is provided with a groove 33. The groove 33 forms a step having an upper surface 38, a lower surface 30 and a slope 39 connecting the upper surface 38 and the lower surface 30. A fusible film 34, a conduction line 35, and a covering film 36 are formed in a manner similar to the above-mentioned production manner. When the fusible film 34 is irradiated with an energy beam 37, the irradiated portion of the fusible film 34 melts and a part of the melt on the insulating layer flows into the groove 33. That is, part of the melted portion of the fusible film 34 flows from the upper surface 38 to the lower surface 30 via the slope 39. Thus, the fusible film 34 is cut at the edge of the groove 33 in the insulating layer 32.

In FIG. 6, an insulating layer 42 formed on a semiconductor substrate 41 is provided with a projection 43, having an upper surface 48 and slopes 49. A fusible film 44, a conduction line 45, and a covering film 46 are formed in a manner similar to the above-mentioned production manner. When the fusible film 44 is irradiated with an energy beam 47, the irradiated portion of the fusible film 44 melts and a part of the melt on the upper surface 48 of the projection 43 flows onto a lower surface 50 of the insulating layer 42. Thus, the fusible film 44 is cut at the projection 43.

It will be obvious that the present invention is not restricted to the above-mentioned embodiments and that many variations are possible for a person skilled in the art without departing from the scope of the present invention.

We claim:

1. A semiconductor device with a fuse, comprising:
   an insulating layer having at least one step, each said step having an upper surface, a lower surface and a slope connecting said upper surface and said lower surface;
   a fusible film covering said step of said insulating layer;
   a conduction line connected to said fusible film; and
   a covering film formed on said fusible film and said conduction line, so that when a portion of said fusible film on said upper surface and said slope of said step is melted by irradiation with an energy beam, the melted portion of said fusible film flows from said upper surface of said step to said lower surface of said step via said slope and said fusible film is cut.

2. A semiconductor device according to claim 1, wherein said insulating layer is provided with a groove and said groove forms said step.

3. A semiconductor device according to claim 1, wherein said insulating layer is provided with two adjacent grooves and said adjacent grooves form said steps, so that said fusible film on said upper surface of said insulating layer between said two adjacent grooves is made to melt and to flow into said grooves by irradiation with the energy beam.

4. A semiconductor device according to claim 1, wherein said fusible film is formed of a material selected from the group consisting of polycrystalline silicon, amorphous silicon, aluminum, and metal silicide.

5. A semiconductor device according to claim 1, wherein said insulating layer is formed of a material selected from the group consisting of silicon dioxide, silicon nitride, silicon oxynitride and tantalum oxide.

6. A semiconductor device according to claim 1, wherein said conduction lines are formed of aluminum, molybdenum, tungsten, and metal silicide.

7. A semiconductor device according to claim 1, wherein said covering film is formed of a material selected from the group consisting of phosphosilicate glass, silicon dioxide, silicon nitride and silicon oxynitride.

8. A semiconductor device according to claim 1, wherein said energy beam is a laser beam.

9. A semiconductor device according to claim 1, wherein said energy beam is an electron beam.

10. A semiconductor device according to claim 1, wherein said insulating layer is provided with a projection and said projection forms said step.

* * * * *

UNITED STATES PATENT AND TRADEMARK OFFICE
CERTIFICATE OF CORRECTION

PATENT NO. : 4,503,315

DATED : March 5, 1985

INVENTOR(S) : Kamioka et al.

It is certified that error appears in the above-identified patent and that said Letters Patent is hereby corrected as shown below:

Col. 1, line 49, after "having" insert --a--;
       line 57, "kmelt" should be --melt--.

Col. 3, line 32, "meet" should be --melt--;
       line 64, "9" should be --29--.

Signed and Sealed this

Sixth Day of August 1985

[SEAL]

Attest:

DONALD J. QUIGG

*Attesting Officer*        *Acting Commissioner of Patents and Trademarks*